(12) United States Patent
Balakrishnan et al.

(10) Patent No.: US 9,437,427 B1
(45) Date of Patent: Sep. 6, 2016

(54) CONTROLLED CONFINED LATERAL III-V EPITAXY

(71) Applicant: International Business Machines Corporation, Armonk, NY (US)

(72) Inventors: Karthik Balakrishnan, White Plains, NY (US); Lukas Czornomaz, Zurich (CH); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/984,546

(22) Filed: Dec. 30, 2015

(51) Int. Cl.
  *H01L 21/02* (2006.01)
  *H01L 21/306* (2006.01)
  *H01L 21/308* (2006.01)

(52) U.S. Cl.
  CPC ..... *H01L 21/02538* (2013.01); *H01L 21/0245* (2013.01); *H01L 21/02236* (2013.01); *H01L 21/308* (2013.01); *H01L 21/30612* (2013.01)

(58) Field of Classification Search
  CPC ........... H01L 21/02538; H01L 21/308; H01L 21/0245; H01L 21/30612; H01L 21/02236
  See application file for complete search history.

(56) References Cited

U.S. PATENT DOCUMENTS

| | | | |
|---|---|---|---|
| 6,963,078 B2 | 11/2005 | Chu | |
| 8,263,474 B2 | 9/2012 | Dip et al. | |
| 8,937,299 B2 | 1/2015 | Basu et al. | |
| 2007/0099329 A1* | 5/2007 | Maa | H01L 31/105 438/57 |
| 2008/0093622 A1* | 4/2008 | Li | H01L 21/02381 257/103 |
| 2009/0039361 A1* | 2/2009 | Li | H01L 21/02381 257/94 |
| 2010/0012976 A1* | 1/2010 | Hydrick | H01L 21/02057 257/190 |
| 2010/0078680 A1* | 4/2010 | Cheng | H01L 27/14612 257/184 |
| 2011/0031529 A1* | 2/2011 | Miura | H01L 21/02381 257/184 |
| 2011/0049568 A1* | 3/2011 | Lochtefeld | H01L 21/02381 257/190 |
| 2012/0199876 A1* | 8/2012 | Bai | C30B 25/183 257/190 |
| 2014/0077279 A1 | 3/2014 | Tu | |
| 2014/0264446 A1* | 9/2014 | Basu | H01L 29/785 257/192 |
| 2015/0072509 A1 | 3/2015 | Chi et al. | |

FOREIGN PATENT DOCUMENTS

| | | | | |
|---|---|---|---|---|
| CN | 102931083 | * | 2/2013 | ....... H01L 21/02381 |
| CN | 102931083 A | | 2/2013 | |
| CN | 104576391 | * | 4/2015 | ........... H01L 21/336 |
| CN | 104576391 A | | 4/2015 | |
| KR | 10-1531870 | * | 6/2015 | ............. H01L 21/20 |
| KR | 10-1531870 B1 | | 6/2015 | |
| KR | 10-1531875 | * | 6/2015 | ............. H01L 21/20 |
| KR | 10-1531875 B1 | | 6/2015 | |

* cited by examiner

*Primary Examiner* — Evan Pert
*Assistant Examiner* — Farid Khan
(74) *Attorney, Agent, or Firm* — Scully, Scott, Murphy & Presser, P.C.; Daniel P. Morris, Esq.

(57) ABSTRACT

After oxidizing a sacrificial semiconductor layer composed of silicon germanium that is located over an insulator layer to form a germanium-enriched region located within a first end of the sacrificial semiconductor layer and having a greater germanium concentration than a remaining portion of the sacrificial semiconductor layer, the remaining portion of the sacrificial semiconductor layer is removed to provide a trench. Next, a semiconductor barrier layer is formed on a sidewall of the germanium-enriched region that is exposed by the trench. A III-V compound semiconductor layer is formed within the trench by a lateral epitaxial semiconductor regrowth process.

13 Claims, 8 Drawing Sheets

CONTROLLED CONFINED LATERAL III-V EPITAXY

BACKGROUND

The present application relates to semiconductor fabrication, and more particularly to methods of forming a III-V compound semiconductor layer by aspect ratio trapping.

High mobility channel devices such as III-V compound semiconductors for n-type field effect transistors (nFETs) and silicon germanium (SiGe) or germanium (Ge) for p-type FET (pFET), have been proposed for future CMOS technology. Aspect ratio trapping has been developed as an effective way to grow high quality, low defect III-V compound semiconductors on a silicon (Si) wafer. Aspect ratio trapping utilizes high aspect ratio openings, such as trenches or holes, to trap dislocations, preventing dislocations from reaching the epitaxial film surface. However, conventional aspect ratio trapping has the following drawbacks: first of all, because high aspect ratio trenches are needed in aspect ratio trapping, the aspect ratio trapping process is applicable for forming fin structures. It is however rather difficult to form a large area planar structure using such an approach, rendering back biasing technique ineffective. Furthermore, the defective seed layer remains after the aspect ratio trapping growth processes. The defective seed layer needs to be isolated from the device layer, otherwise it can cause excessive device leakage. Therefore, there remains a need for a method of forming III-V compound semiconductors without suffering the above drawbacks of the conventional aspect ratio trapping.

SUMMARY

The present application provides methods of forming a large substantially defect-free active region composed of a III-V compound semiconductor material over an insulator layer for fabrication high mobility nFETs. The III-V compound semiconductor active region is formed by a lateral epitaxial semiconductor regrowth process.

In one aspect of the present application, a method of forming a semiconductor structure is provided. In one embodiment of the present application, the method includes forming dielectric material layer over a sacrificial semiconductor layer that is located over a region of an insulator layer. The sacrificial semiconductor layer includes silicon-germanium having a first germanium concentration. After forming a first trench opening extending through the dielectric material layer and the sacrificial semiconductor layer to expose a first sidewall of the sacrificial semiconductor layer, the sacrificial semiconductor layer is oxidized to form an oxide region over the first sidewall of the sacrificial semiconductor layer and a germanium-enriched region within the sacrificial semiconductor layer and adjoined to the oxide region. The germanium-enriched region has a second germanium concentration greater than the first germanium concentration. A second trench opening is then formed extending through the dielectric material layer and the sacrificial semiconductor layer to expose a second sidewall of the sacrificial semiconductor layer opposite to the first sidewall. Next, the sacrificial semiconductor layer is removed to provide a trench that exposes a sidewall of the germanium-enriched region. After forming a semiconductor barrier layer over the exposed sidewall of the germanium-enriched region, a III-V compound semiconductor material is grown within the trench and laterally outwards from a sidewall surface of the semiconductor barrier layer to provide a III-V compound semiconductor layer. A defect-containing region of the III-V compound semiconductor layer is then removed.

In another embodiment of the present application, the method includes forming a dielectric material layer over a sacrificial semiconductor layer that is located over a region of an insulator layer. The sacrificial semiconductor layer includes silicon-germanium having a high germanium concentration. After forming a first trench opening extending through the dielectric material layer and the sacrificial semiconductor layer to expose a first sidewall of the sacrificial semiconductor layer, a seed layer is formed over the first sidewall of the sacrificial semiconductor layer. Next, a second trench opening is formed extending through the dielectric material layer and the sacrificial semiconductor layer to expose a second sidewall of the sacrificial semiconductor layer opposite to the first sidewall. After removing the sacrificial semiconductor layer to provide a trench that exposes a sidewall surface of the seed layer, a III-V compound semiconductor material is grown within the trench and laterally outwards from the sidewall surface of the seed layer to provide a III-V compound semiconductor layer. A defect-containing region of the III-V compound semiconductor layer is then removed.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
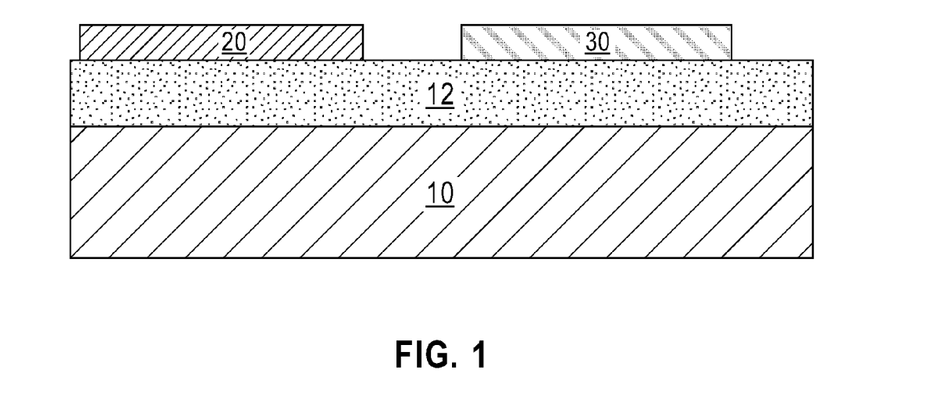
FIG. 1 is a cross sectional view of a first exemplary semiconductor structure including a handle substrate, an insulator layer, a semiconductor layer located over a first region of the insulator layer and a sacrificial semiconductor layer located over a second region of the insulator layer that can be employed according to a first embodiment of the present application.

Referring first to FIG. 1, a first exemplary semiconductor structure according to a first embodiment of the present application includes a substrate that supports a semiconductor layer 20 located in a first region of the substrate and a sacrificial semiconductor layer 30 located in a second region of the substrate. In one embodiment, the first region is a pFET region and the second region is an nFET region.

The substrate includes, from bottom to top, a handle substrate 10 and an insulator layer 12. The handle substrate 10 may comprise a semiconductor material. The term "semiconductor" as used herein in connection with the semiconductor material of the handle substrate 10 denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the handle substrate 10 may be comprised of silicon. The thickness of the handle substrate can be from 30 μm to about 2 mm, although lesser and greater thicknesses can also be employed.

The insulator layer 12 may be a crystalline or non-crystalline oxide and/or nitride. In one embodiment, the insulator layer 12 is an oxide such as, for example, silicon dioxide. In another embodiment, the insulator layer 12 is a nitride such as, for example, silicon nitride or boron nitride. In yet still another embodiment of the present application, the insulator layer 12 may be a multilayered structure such as a stack of, in any order, silicon dioxide and boron nitride. The thickness of the insulator layer 12 that may be used in the present application can be from 10 nm to 200 nm, although lesser and greater thicknesses can also be employed.

The semiconductor layer 20 may include an elemental semiconductor material or a compound semiconductor material such as, for example, Si, Ge, or SiGe. The semiconductor material that provides the semiconductor layer 20 can be a single crystalline semiconductor material, a polycrystalline material or an amorphous material. In one embodiment, the semiconductor layer 20 includes single crystalline silicon.

The sacrificial semiconductor layer 30 may include SiGe having a low Ge concentration. As used herein, the term "low Ge concentration" means a Ge concentration in a SiGe alloy is no greater than 25%. In one embodiment of the present application, the Ge concentration in the sacrificial semiconductor layer 30 is in a range from 20% to 25%. The sacrificial semiconductor layer 30 is typically single crystalline.

The semiconductor layer 20 and the sacrificial semiconductor layer 30 may be formed by conventional CMOS manufacturing process techniques. For example, the semiconductor layer 20 can be formed by providing a semiconductor-on-insulator (SOI) substrate including, from bottom to top, the handle substrate 10, the insulator layer 12 and a top semiconductor layer (not shown) and etching the top semiconductor layer. The remaining portion of the top semiconductor layer of the SOI substrate constitutes the semiconductor layer 20. The sacrificial semiconductor layer 30 can be formed via an epitaxial growth of SiGe with a desired Ge concentration in the second region of the substrate.

Each of the semiconductor layer 20 and the sacrificial semiconductor layer 30 may have a thickness from 30 nm to 100 nm, although lesser and greater thicknesses can also be employed.

Figure 2:
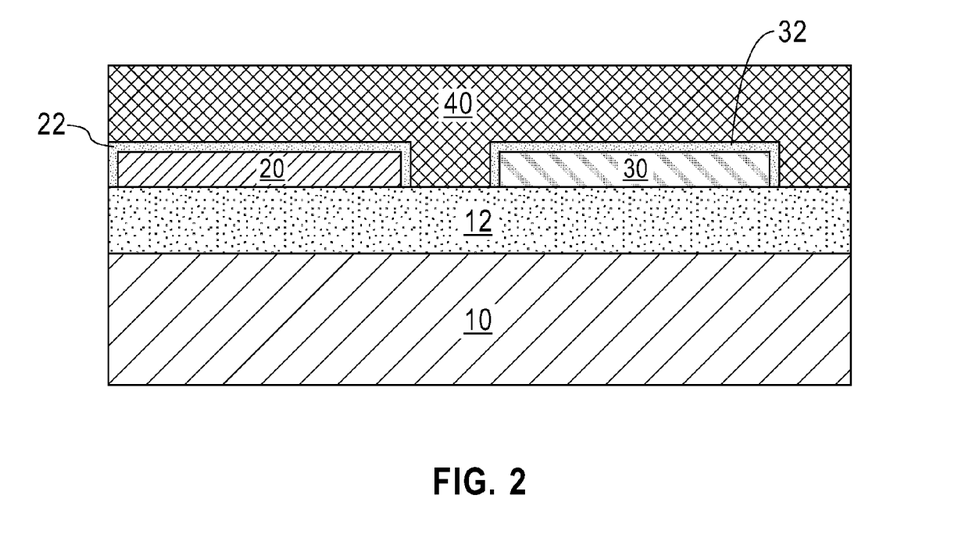
FIG. 2 is a cross sectional view of the first exemplary semiconductor structure of FIG. 1 after sequentially forming a first dielectric liner over exposed surfaces of the semiconductor layer and a second dielectric liner over exposed surfaces of the sacrificial semiconductor layer and a dielectric material layer over the first and second dielectric liners and the insulator layer.

Referring now to FIG. 2, a dielectric liner is formed on each of the semiconductor layer 20 and the sacrificial semiconductor layer 30. Specifically, a first dielectric liner 22 is formed on exposed surfaces (i.e., a top surface and sidewalls) of the semiconductor layer 20 and a second dielectric liner 32 is formed on exposed surfaces (i.e., a top surface and sidewalls) of the sacrificial semiconductor layer 30. In one embodiment, each of the first and the second dielectric liners 22, 32 may include a dielectric nitride such as, for example, silicon nitride, silicon oxynitride or boron nitride. Each of the first and the second dielectric liners 22, 32 may be conformally deposited for example, by chemical vapor deposition (CVD) or atomic layer deposition (ALD). Alternatively, the first and the second dielectric liners 22, 32 may be formed by conversion of surface portions of the semiconductor layer 20 and the sacrificial semiconductor layer 30 by thermal nitridation and/or plasma nitridation. The thickness of the first dielectric liner 22 and the thickness of the second dielectric liner 32 can be in a range from 2 nm to 10 nm, although lesser and greater thicknesses can also be employed.

A dielectric material layer 40 is formed over the first and the second dielectric liners 22, 32 and the exposed surface of the insulator layer 12. The dielectric material layer 40 may include a dielectric oxide such as, for example undoped silicon dioxide, doped silicon oxide, porous or non-porous organosilicate glass, porous or non-porous nitrogen-doped organosilicate glass, or a combination thereof. In one embodiment, the dielectric oxide that provides the dielectric material layer 40 can be the same as the dielectric oxide that provides the insulator layer 12. The dielectric material layer 40 may be deposited using a conventional deposition process, such as, for example, CVD, plasma enhanced chemical vapor deposition (PECVD) or spin coating. If the dielectric material layer 40 is not self-planarizing, the top surface of the dielectric material layer 40 can be planarized, for example, by chemical mechanical planarization (CMP). The planarized top surface of dielectric material layer 40 is located above the top surfaces of the first and the second dielectric liners 22, 32. The thickness of the dielectric material layer 40 can be from 50 nm to 100 nm, although lesser and greater thicknesses can also be employed.

Figure 3:
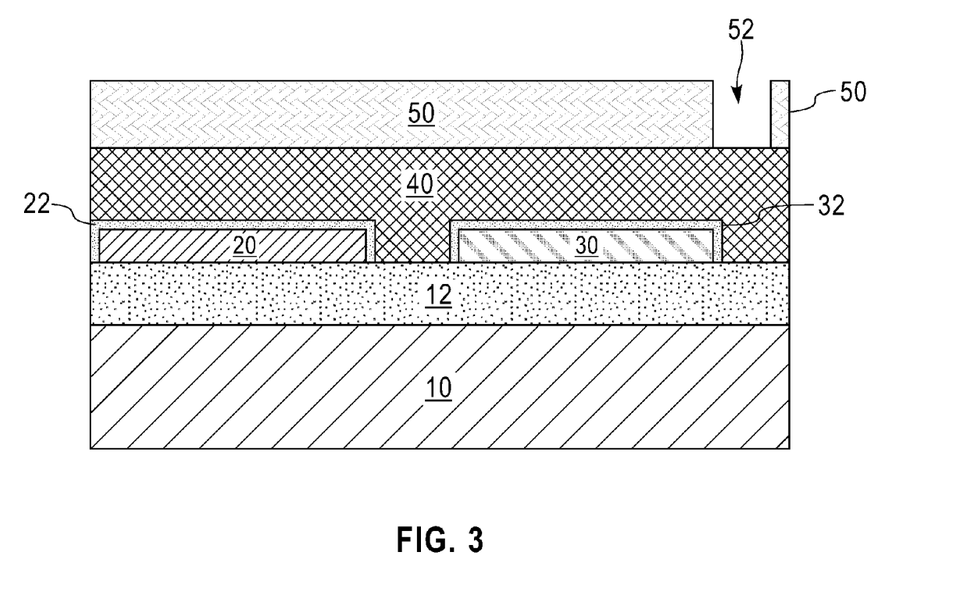
FIG. 3 is a cross sectional view of the first exemplary semiconductor structure of FIG. 2 after forming a first mask layer containing a first opening that exposes a first end portion of the sacrificial semiconductor layer.

Referring now to FIG. 3, a first mask layer 50 containing a first opening 52 that exposes a first end portion of the sacrificial semiconductor layer 30 is formed. The first mask layer 50 that is formed directly on the top surface of the dielectric material layer 40 may include a dielectric material that has a different etch selectivity than the dielectric materials of the dielectric material layer 40, the dielectric liner 32 and the insulator layer 12 and the semiconductor material that provides the sacrificial semiconductor layer 30. In one embodiment, the first mask layer 50 may include a hard mask material such as, for example, a dielectric oxide, a dielectric nitride, or any combination thereof including multilayers. In one embodiment, the hard mask material that can be used in providing the first mask layer 50 can be comprised of silicon dioxide. In another embodiment, the hard mask material that can be used in providing the first mask layer 50 can be comprised of silicon nitride. In yet another embodiment, the hard mask material that can be used in providing the first mask layer 50 can be a stack comprised of, in any order, silicon dioxide and silicon nitride. The first mask layer 50 can be formed by a deposition process such as, for example, CVD or PECVD. The thickness of the first mask layer 50 can range from 30 nm to 60 nm, although lesser and greater thicknesses can also be employed.

After providing the first mask layer 50, lithography and etching can be used to pattern the first mask layer 50 and to provide the first opening 52 within the first mask layer 50. Lithography includes forming a photoresist layer (not shown) on a topmost surface of the first mask layer 50. The photoresist layer may include a positive-tone photoresist composition, a negative-tone photoresist composition or a hybrid-tone photoresist composition. The photoresist layer may be formed by a deposition process such as, for example, spin coating. After forming the photoresist layer, the photoresist layer is subjected to a pattern of irradiation. Next, the exposed photoresist material is developed utilizing a conventional resist developer. This provides a patterned photoresist layer atop a portion of the first mask layer 50. The pattern provided by the patterned photoresist layer is thereafter transferred into the underlying first mask layer 50 utilizing a pattern transfer etching process. Typically, the pattern transfer etching process is an anisotropic etch. In one embodiment, a dry etching process such as, for example, reactive ion etching (RIE) can be used. In another embodiment, a wet etching process involving a chemical etchant can be used. In still a further embodiment, a combination of dry etching and wet etching can be used. The patterned photoresist layer can be removed after forming the first opening 52 utilizing any conventional resist stripping process such as, for example, ashing.

Figure 4:
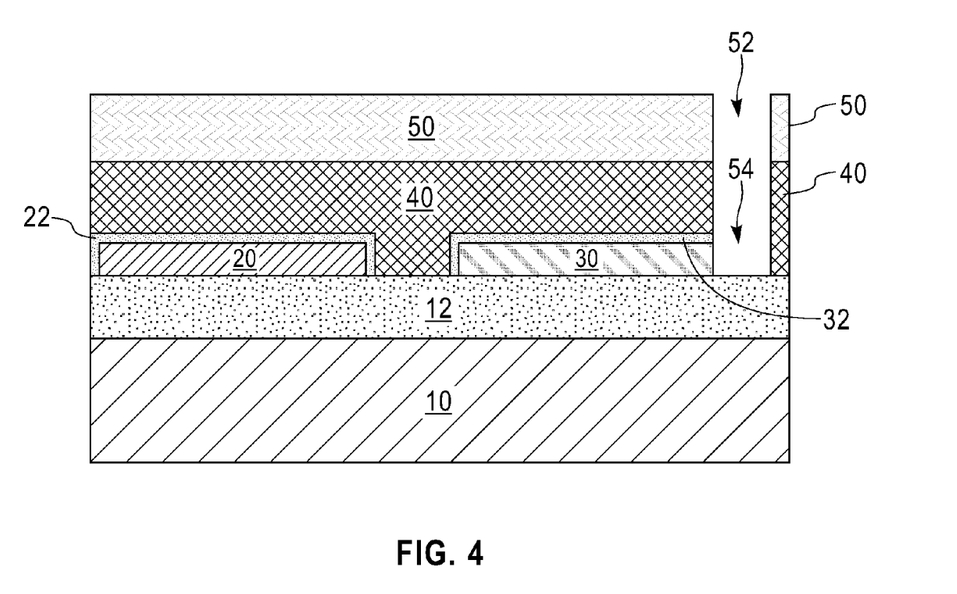
FIG. 4 is a cross sectional view of the first exemplary semiconductor structure of FIG. 3 after removing portions of the dielectric material layer, the second dielectric liner and the sacrificial semiconductor layer that are exposed by the first opening to provide a first trench opening underneath the first opening.

Referring now to FIG. 4, a first trench opening 54 is formed extending through the dielectric material layer 40, the second dielectric liner 32 and the sacrificial semiconductor layer 30 to expose a surface of the insulator layer 12. The first trench opening 54 also exposes a sidewall of the sacrificial semiconductor layer 30. An anisotropic etch such as RIE can be performed to remove portions of the dielectric material layer 40, the second dielectric liner 32 and the sacrificial semiconductor layer layer 30 that are exposed by the first opening 52, thereby providing the first trench opening 54 underneath the first opening 52. In some embodiments of the present application, the insulator layer 20 may be overetched by increasing the etching time in order to completely remove the portion of the sacrificial semiconductor layer 30 located underneath the first opening 52. Thus, the bottom surface of the first trench opening 54 can be coplanar with (as shown in FIG. 4) or located below the top surface of the insulator layer 12 (not shown).

Figure 5:
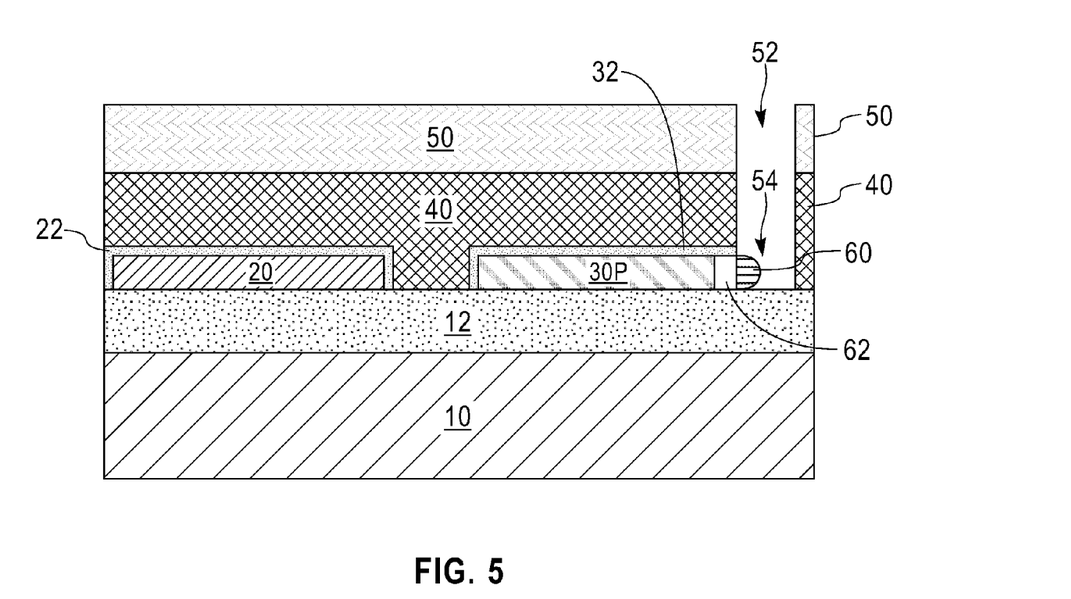
FIG. 5 is a cross sectional view of the first exemplary semiconductor structure of FIG. 4 after forming an oxide region over a sidewall surface of the sacrificial semiconductor layer that is exposed by the first trench opening and a Ge-enriched region located between the oxide region and a sacrificial semiconductor layer portion.

Referring now to FIG. 5, the sacrificial semiconductor layer 30 is thermally oxidized to form an oxide region 60 over the sidewall of the sacrificial semiconductor layer 30 exposed by the first trench opening 54. Dry or wet oxidation can be employed to form the oxide region 60. In one embodiment, a dry oxidation process is performed within a temperature range from 700° C. to 900° C. Because Si is more easily oxidized than Ge, the oxide region 60 comprises primarily silicon dioxide. The thickness of the oxide region 60 can be from 3 nm to 10 nm, although lesser and greater thicknesses can also be employed As Si in the sacrificial semiconductor layer 30 is oxidized to provide the oxide region 60, Ge is condensed at the first end portion of the sacrificial semiconductor layer 30 to provide a Ge-enriched region 62 adjoined to the oxide region 60. The Ge-enriched region 62 has a greater Ge concentration than the Ge-concentration of the remaining portion of the sacrificial semiconductor layer 30 (herein referred to as the sacrificial semiconductor layer portion 30P). In one embodiment, the Ge concentration in the Ge-enriched region 62 can be from 50% to 70%. The thickness of the Ge-enriched region 62 can be from 3 nm to 5 nm, although lesser and greater thicknesses can also be employed. Various oxidation process parameters (e.g., duration, temperature and pressure) can be varied to alter the thickness and Ge concentration of the Ge-enriched region 62. The Ge-enriched region 62 acts as a seed layer for subsequent epitaxial growth of a III-V compound semiconductor material. SiGe has a lesser lattice mismatch to III-V compound semiconductor materials compared to Si, employing SiGe as the seed layer thereby minimizes generation of dislocation defects in a III-V compound semiconductor layer subsequently formed. After Ge condensation, the first mask layer 50 can be removed, for example, by oxygen-based plasma etching.

Figure 6:
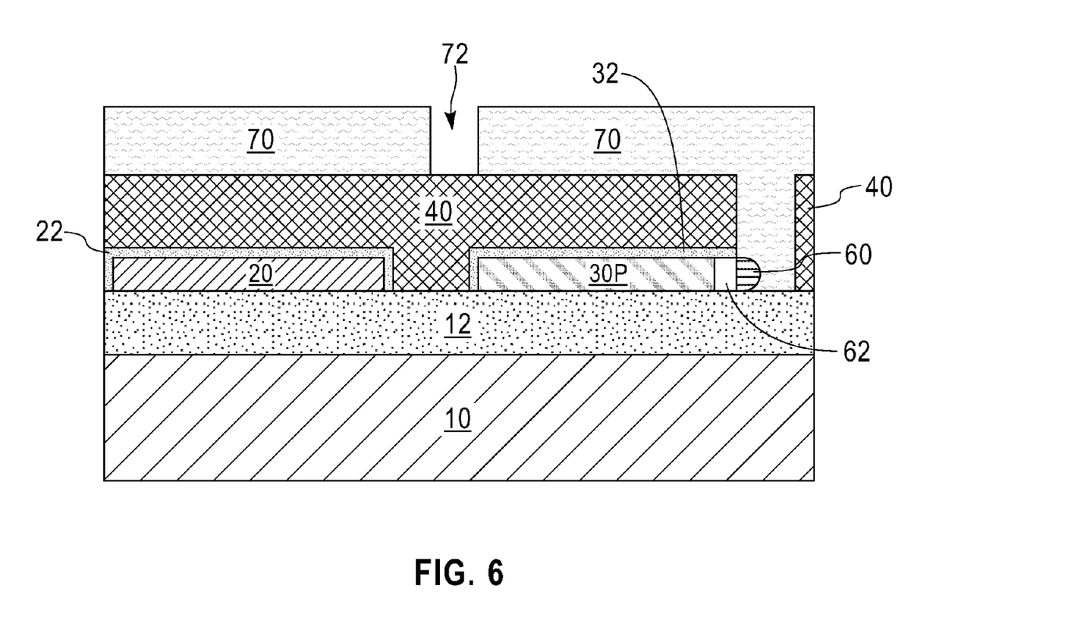
FIG. 6 is a cross sectional view of the first exemplary semiconductor structure of FIG. 5 after forming a second mask layer containing a second opening that exposes an end portion of the sacrificial semiconductor layer portion.

Referring now to FIG. 6, a second mask layer 70 containing a second opening 72 that exposes a second end portion of the sacrificial semiconductor layer 30 is formed. The second mask layer 70 is formed over the dielectric material layer 40, the insulator layer 20 and the oxide region 60 to completely fill the first trench opening 54. The second mask layer 70 can include a hard mask material the same as, or different from, the hard mask material providing the first mask layer 50. The second mask layer 70 can be formed utilizing one of the deposition processes described above for providing the first mask layer 50. The second mask layer 70 can have a thickness within the thickness of the first mask layer 50 mentioned above.

After providing the second mask layer 70, lithography and etching processes described above in patterning the first mask layer 50 can be employed to pattern the second mask layer 70, thereby providing the second opening 72 within the second mask layer 70.

Figure 7:
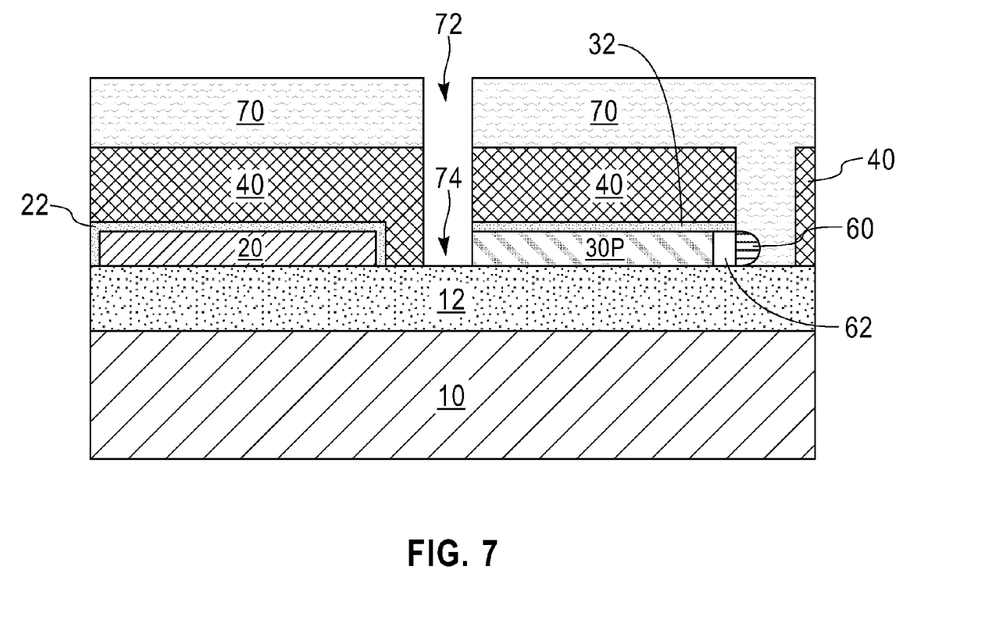
FIG. 7 is a cross sectional view of the first exemplary semiconductor structure of FIG. 6 after removing portions of the dielectric material layer portion, the second dielectric liner and the sacrificial semiconductor layer portion that are exposed by the second opening to provide a second trench opening underneath the second opening.

Referring now to FIG. 7, a second trench opening 74 is formed by removing portions of the dielectric material layer 40, the second dielectric liner 32 and the sacrificial semiconductor layer portion 30P that are exposed by the second opening 72. The second trench opening 74 exposes a surface of the insulator layer 12 and a sidewall of the sacrificial semiconductor layer portion 30P. The second trench opening 74 can be formed by performing an anisotropic etch such as described above in formation of the first trench opening 54. After forming the second trench opening 74, the second mask layer 70 can be removed, for example, by oxygen-based plasma etching.

Figure 8:
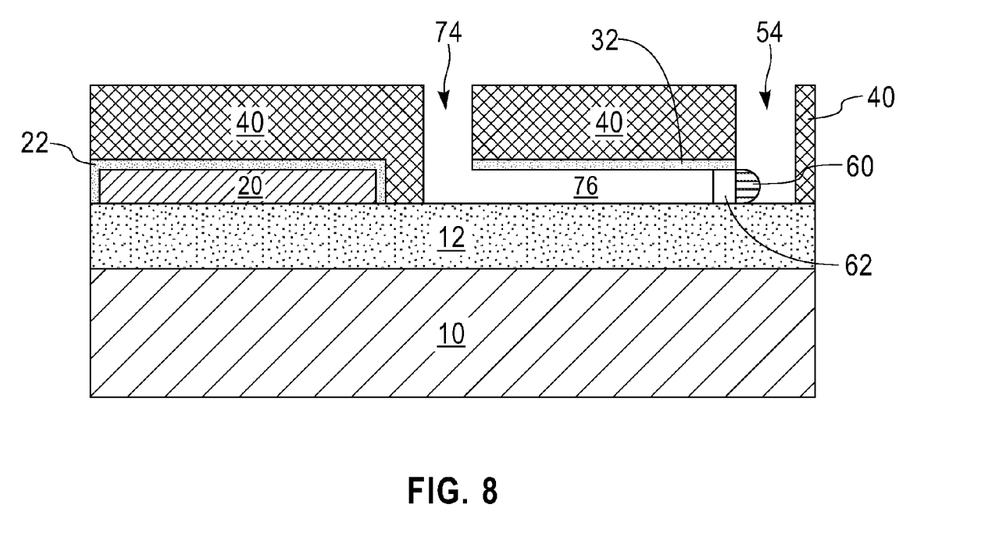
FIG. 8 is a cross sectional view of the first exemplary semiconductor structure of FIG. 7 after removing the sacrificial semiconductor layer portion to provide a trench.

Referring now to FIG. 8, the sacrificial semiconductor layer portion 30P is removed to provide a trench 76. As is shown, the trench 76 exposes a sidewall of the Ge-enriched region 62. The etch that can be used in providing the trench 76 is a lateral etch that includes etchants that are selective in removing a SiGe material with a lower Ge concentration that provides sacrificial semiconductor layer portion 30P relative to the SiGe with a higher Ge concentration that provides the Ge-enriched region 62 and the dielectric material that provides the insulator layer 12 or the second dielectric liner 32. In one embodiment, the etch that provides the trench 76 may include hydrogen peroxide, i.e., $H_2O_2$.

Figure 9:
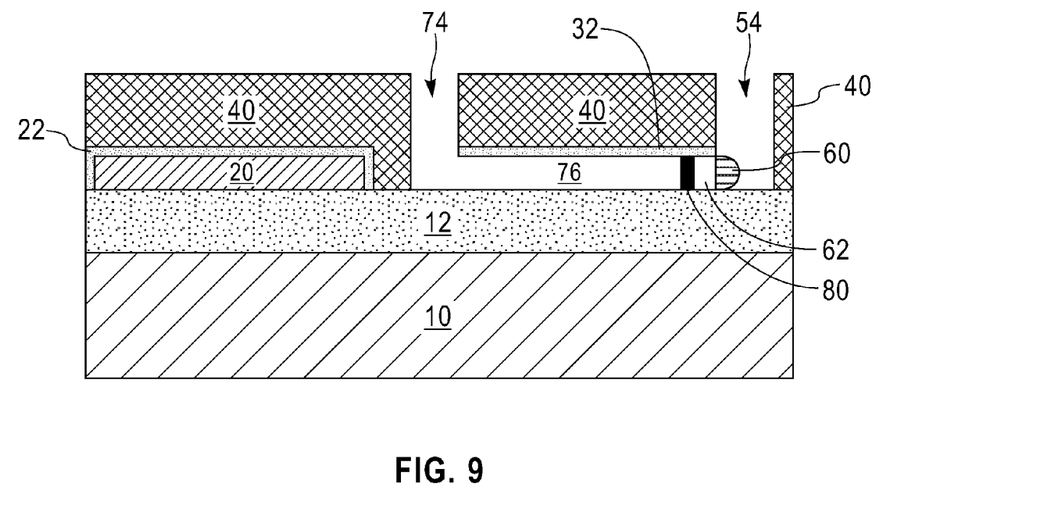
FIG. 9 is a cross sectional view of the first exemplary semiconductor structure of FIG. 8 after forming a semiconductor barrier layer on a sidewall surface of the Ge-enriched region exposed by the trench.

Referring now to FIG. 9, a semiconductor barrier layer 80 is formed on the sidewall surface of the Ge-enriched region 62 that is exposed by the trench 76. The semiconductor burlier layer 80 prevents Ge out-diffusion from the Ge-enriched region 62 into the subsequently formed III-V compound semiconductor layer during epitaxial growth of the III-V compound semiconductor material. Serious leakage caused by the autodiffusion of Ge can thus be avoided. In one embodiment, the semiconductor barrier layer 80 is composed of Si. The semiconductor barrier layer 80 can be formed by a selective epitaxial growth process including, but not limited to, atmospheric-pressure CVD (APCVD), low-pressure CVD (LPCVD), ultra-high-vacuum CVD (UHVCVD), by molecular beam epitaxy (MBE), metal-organic CVD (MOCVD) or ALD. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. During the selective epitaxial growth, the semiconductor material providing the semiconductor barrier layer 80 is deposited on the semiconductor surface, i.e., the sidewall surface of the Ge-enriched region 62 that is exposed by the trench 76, but not on dielectric surfaces such as surfaces of the dielectric material layer 40, the insulator layer 12, the second dielectric liner 32 and the oxide region 60. The semiconductor barrier layer 80 thus has a same crystalline orientation as the Ge-enriched region 62. The thickness of the semiconductor barrier layer 80 can be from 3 nm to 5 nm, although lesser and greater thicknesses can also be employed.

Figure 10:
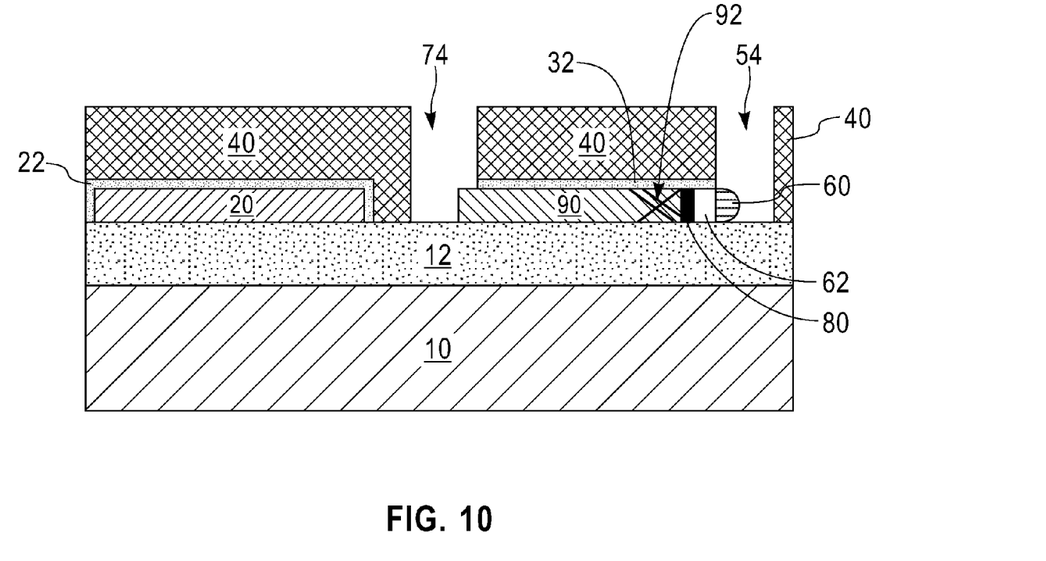
FIG. 10 is a cross sectional view of the first exemplary semiconductor structure of FIG. 9 after growing a III-V compound semiconductor layer within the trench by utilizing an aspect ratio trapping process.

Referring now to FIG. 10, a III-V compound semiconductor layer 90 is grown within the trench 76 utilizing an aspect ratio trapping growth process. The aspect ratio trapping growth process may be referred to herein as a lateral epitaxial semiconductor regrowth process in which a III-V compound semiconductor is grown laterally outwards from the sidewall surface of the semiconductor barrier layer 80 that is exposed by the trench 76. The lateral epitaxial semiconductor regrowth process employed in the present application allows forming a large area III-V compound semiconductor region for fabrication of planar nFETs. The lateral epitaxial semiconductor regrowth process that can be used in the present application is similar to the process mentioned in U.S. Patent Application Publication No. 2011/0049568 to Lochtefeld et al., the entire content and disclosure of which is incorporated herein by reference, except that lateral growth is used in the present application rather than bottom-up growth as disclosed in the aforementioned publication.

The term "III-V compound semiconductor" as used in conjunction with the III-V compound semiconductor layer 90 denotes a semiconductor material that has semiconductor properties and includes at least one element from Group III (i.e., B, Al, Ga, and/or In) of the Periodic Table of Elements and at least one element from Group V (i.e., N, P, As, Sb and/or Bi) of the Periodic Table of Elements. The range of possible formulae is quite broad because the elements can form binary compound semiconductors, tertiary compound semiconductors and even quaternary compound semiconductors. In one embodiment of the present application, InAs, GaAs, InP, or InGaAs can be used as the III-V compound semiconductor material in the III-V compound semiconductor layer 90.

The III-V compound semiconductor layer 90 can be formed by selective epitaxial growth described above in forming the semiconductor barrier layer 80 in any suitable epitaxial deposition system. In the CVD process, selective epitaxial growth typically includes introducing a source gas into the chamber. The source gas may include III-V compound forming precursor gases and a carrier gas, such as, for example hydrogen. The reactor chamber is heated, such as, for example, by lamp-heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

During the selective epitaxial growth, the III-V compound semiconductor material is deposited over the semiconductor surface, i.e., the sidewall surface of the semiconductor barrier layer 80 that is exposed by the trench 76. In one embodiment of the present application, the epitaxial deposition may be continued until a sidewall of the III-V compound semiconductor layer 90 extends beyond a sidewall of the second trench opening 74.

The III-V compound semiconductor layer 90 includes a defect-containing region 92 laterally adjoined to the sidewall surface of the semiconductor barrier layer 80. The defective-containing region 92, which also includes a same III-V compound semiconductor material as III-V compound semiconductor layer 90, has a defect density that is greater than a defect density of the III-V compound semiconductor layer 90. A portion of the III-V compound semiconductor layer that is adjoined to the defect-containing region 92 can therefore be substantially defect-free. As used herein, the term "substantially defect free" means a defect density in a III-V compound semiconductor material is less than $1 \times 10^5$ defects/cm$^2$.

Notably, and since an epitaxial semiconductor regrowth process is used in forming the III-V compound semiconductor layer 90, the III-V compound semiconductor layer 90 has a same crystalline characteristic as the semiconductor material of the deposition surface. Thus, in the present application, the III-V compound semiconductor layer 90 has an epitaxial relationship, i.e., same crystal orientation, with the sidewall surface of the semiconductor barrier layer 80 that is exposed by the trench 76.

Figure 11:
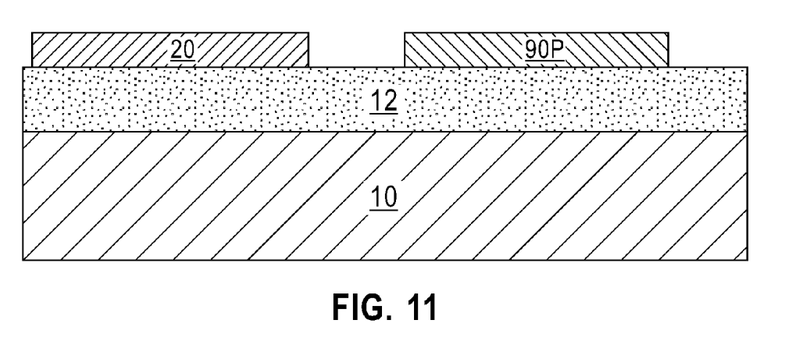
FIG. 11 is a cross sectional view of the first exemplary semiconductor structure of FIG. 9 after forming a III-V compound semiconductor layer portion.

Referring now to FIG. 11, the oxide region 60, the Ge-rich region 62, the semiconductor barrier layer 80 and the defect-containing region 92 are removed from the second region of the substrate (10, 12) by an anisotropic etch such as, for example, RIE. After etching, a portion of the III-V compound semiconductor layer 90 that has the lower defect density than the defect-containing region 92 remains. The remaining portion of the III-V compound semiconductor layer 90 is herein referred to as the III-V compound semiconductor layer portion 90P. The III-V compound semiconductor layer portion 90P provides an active III-V compound semiconductor region in which an nFET can subsequently be formed. By removing the defect-containing region 92 from the structure, the III-V compound semiconductor layer portion 90P of the present application is substantially defect-free. The stability of the nFET formed thereon can thus be greatly increased.

After forming the III-V compound semiconductor layer portion 90P, the dielectric material layer 40 and the first and the second dielectric liners 22, 32 are removed by one or more etches. The etches be a dry etch, a wet etch or a combination thereof. After etching, the semiconductor layer 20 and the III-V compound semiconductor layer portion 90P remain.

At this point of the present application, a first gate structure can be formed over a portion of the semiconductor layer 20 and a second gate structure can be formed over a portion of the III-V compound semiconductor layer portion 90P to a provide a planar CMOS structure (not shown). The first and the second gate structures can be formed utilizing a gate first or a gate last process known in the art. Alternatively, before formation of the first and the second gate structures, the semiconductor layer 20 and the III-V compound semiconductor layer portion 90P can be patterned to form fin structures, thus providing a fin CMOS structure.

Figure 12:
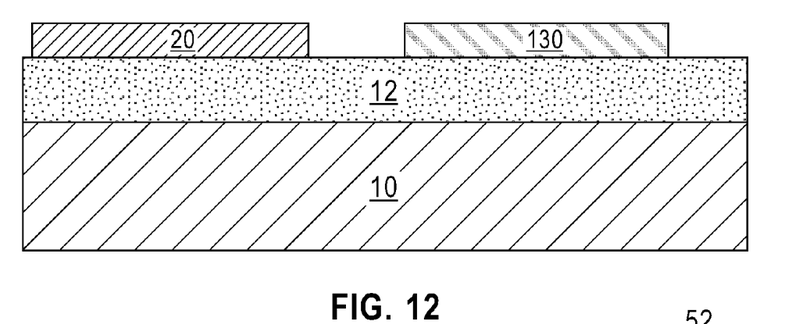
FIG. 12 is a cross sectional view of a second exemplary semiconductor structure including a handle substrate, an insulator layer, a semiconductor layer located over a first region of the insulator layer and a sacrificial semiconductor layer located over a second region of the insulator layer that can be employed according to a second embodiment of the present application.

Referring now to FIG. 12, a second exemplary semiconductor structure according to a second embodiment of the present application can be derived from FIG. 1 by employing a sacrificial semiconductor layer 130 including SiGe having a high Ge concentration in lieu of SiGe having a low Ge concentration in the first embodiment. As used herein, the term "high Ge concentration" means a Ge concentration in a SiGe alloy is 35% or higher. In one embodiment, the Ge concentration in the sacrificial semiconductor layer 130 can be from 50% to 70%.

Figure 13:
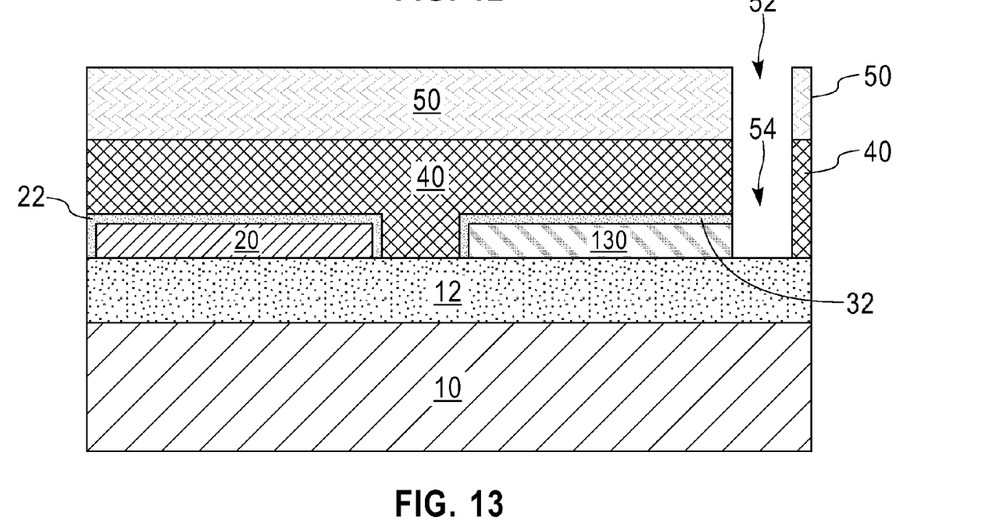
FIG. 13 is a cross sectional view of the second exemplary semiconductor structure of FIG. 12 after forming a first trench opening to expose a sidewall of the sacrificial semiconductor layer located at a first end of the sacrificial semiconductor layer.

Referring now to FIG. 13, the processing steps of FIG. 2 are performed to form a first dielectric liner 22 over the exposed surfaces of the semiconductor layer 20 and a second dielectric liner 32 over the exposed surfaces of the sacrificial semiconductor layer 130 and to form a dielectric material layer 40 over the first and the second dielectric liners 22, 32 and the insulator layer 12.

Subsequently, the processing steps of FIGS. 3 and 4 are sequentially performed to form a first hard mask layer 50 including a first opening 52 over the dielectric material layer 40 and to form a first trench opening 54 that extends through the dielectric material layer 40, the second dielectric liner 32 and the sacrificial semiconductor layer 130 at the first end of the sacrificial semiconductor layer 30.

Figure 14:
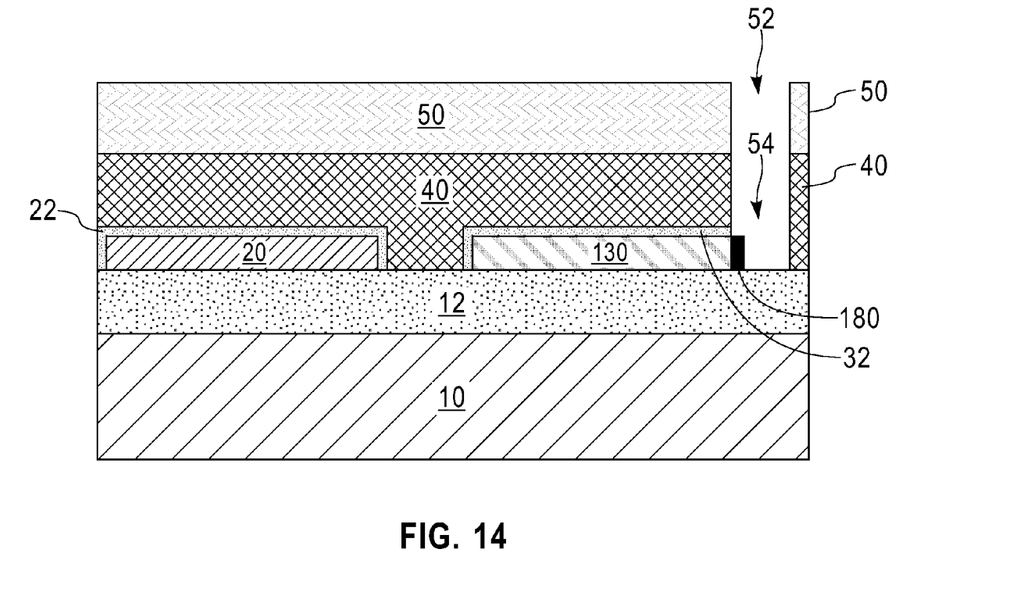
FIG. 14 is a cross sectional view of the second exemplary semiconductor structure of FIG. 13 after forming a seed layer over the exposed sidewall of the sacrificial semiconductor layer.

Referring now to FIG. 14, a seed layer 180 is formed over a sidewall surface of the sacrificial semiconductor layer 130 that is exposed by the first trench opening 54. The seed layer 180 may include a semiconductor material that can support the epitaxial growth of III-V compound semiconductor. In one embodiment, the seed layer 180 includes Si. The seed layer 180 can be formed by selective epitaxial growth described above in formation of the semiconductor barrier layer 80. The thickness of the seed layer 180 can be from 10 nm to 20 nm, although lesser and greater thicknesses can also be employed. After forming the seed layer 180, the first mask layer 50 can be removed, for example, by oxygen-based plasma etching.

Figure 15:
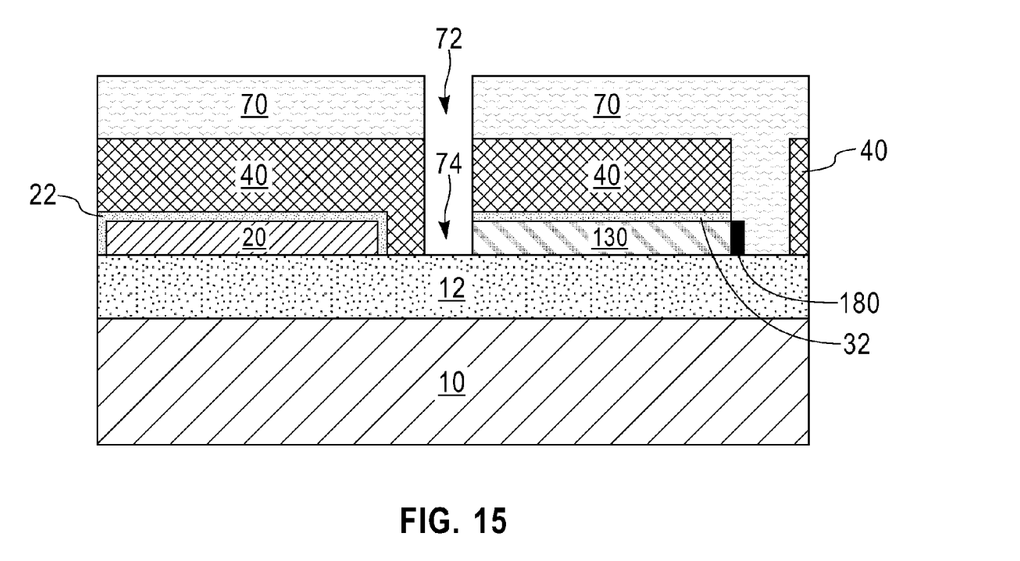
FIG. 15 is a cross sectional view of the second exemplary semiconductor structure of FIG. 14 after forming a second trench opening to expose a sidewall of the sacrificial semiconductor layer located at a second end of the sacrificial semiconductor layer.

Referring now to FIG. 15, the processing steps of FIGS. 6 and 7 are sequentially performed to form a second hard mask layer 70 including a second opening 72 over the dielectric material layer 40, the seed layer 180 and the insulator layer 12 and to form a second trench opening 74 that extends though the dielectric material layer 40, the second dielectric liner 32 and the sacrificial semiconductor layer 130 at the second end of the sacrificial semiconductor layer 130.

Figure 16:
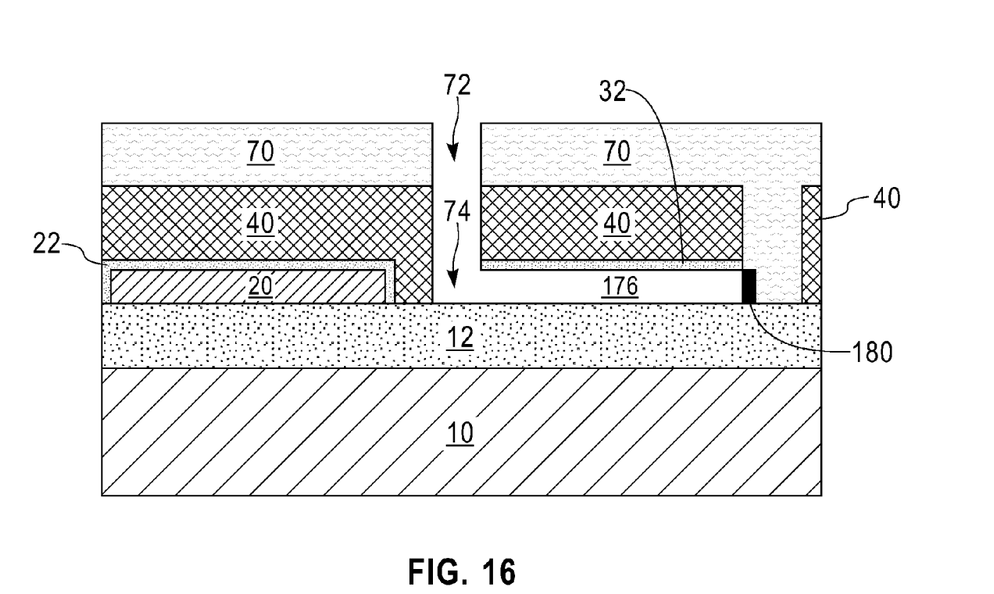
FIG. 16 is a cross sectional view of the second exemplary semiconductor structure of FIG. 15 after removing the sacrificial semiconductor layer to provide a trench.

Referring now to FIG. 16, the sacrificial semiconductor layer 130 is removed to provide a trench 176. The trench 176 exposes a sidewall of the seed layer 180. The etch that can be used in providing the trench 176 is a lateral etch that includes etchants that are selective in removing SiGe with a high Ge concentration that provides the sacrificial semiconductor layer 130 relative to the semiconductor material that provides the seed layer 180 and the dielectric material that provides the insulator layer 12 or the second dielectric liner 32. In one embodiment, the etch that provides the trench 176 may include gaseous HCl.

Figure 17:
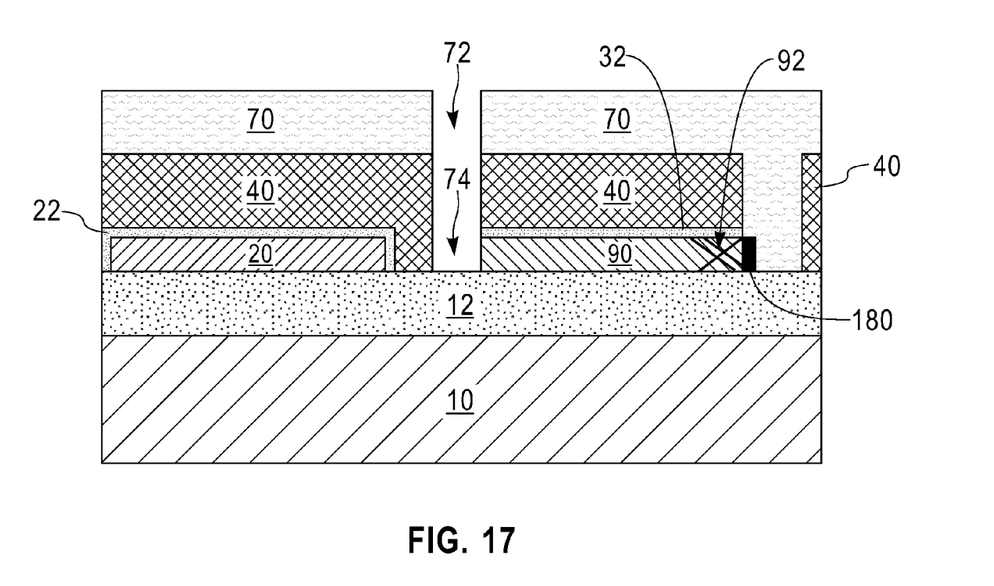
FIG. 17 is a cross sectional view of the second exemplary semiconductor structure of FIG. 16 after growing a III-V compound semiconductor layer within the trench by utilizing an aspect ratio trapping process.

Referring now to FIG. 17, the processing steps of FIG. 10 are performed to form a III-V compound semiconductor layer 90 within the trench 176. The III-V compound semiconductor layer 90 includes a defect-containing region 92 laterally adjoined to the seed layer 180. After forming III-V compound semiconductor layer 90, the second mask layer 70 can be removed, for example, by oxygen-based plasma etching.

Next, the processing steps of FIG. 11 are performed to remove the seed layer 180 and the defect-containing region 92 from the second exemplary semiconductor structure, thereby providing a III-V compound semiconductor layer portion 90P which can be employed as an active III-V compound semiconductor region for an nFET subsequently formed. The dielectric material layer 40 and the first and the second dielectric liners 22, 32 are subsequently removed to expose the semiconductor layer 20 and the III-V compound semiconductor layer portion 90P.

At this point of the present application, a first gate structure can be formed over a portion of the semiconductor layer 20 and a second gate structure can be formed over a portion of the III-V compound semiconductor layer portion 90P to a provide a planar CMOS structure (not shown). The first and the second gate structures can be formed utilizing a gate first or a gate last process known in the art. Alternatively, before formation of the first and the second gate structures, the semiconductor layer 20 and the III-V compound semiconductor layer portion 90P can be patterned to form fin structures, thus providing a fin CMOS structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming dielectric material layer over a sacrificial semiconductor layer that is located over a region of an insulator layer, wherein the sacrificial semiconductor layer comprises silicon-germanium having a first germanium concentration;
    forming a first trench opening extending through the dielectric material layer and the sacrificial semiconductor layer, wherein the first trench opening exposes a first sidewall of the sacrificial semiconductor layer;
    oxidizing the sacrificial semiconductor layer to form an oxide region over the first sidewall of the sacrificial semiconductor layer and a germanium-enriched region within the sacrificial semiconductor layer and adjoined to the oxide region, wherein the germanium-enriched region has a second germanium concentration greater than the first germanium concentration;
    forming a second trench opening extending through the dielectric material layer and the sacrificial semiconductor layer, wherein the second trench opening exposes a second sidewall of the sacrificial semiconductor layer opposite to the first sidewall;
    removing the sacrificial semiconductor layer to provide a trench, wherein the trench exposes a sidewall of the germanium-enriched region;
    forming a semiconductor barrier layer over the exposed sidewall of the germanium-enriched region;
    growing a III-V compound semiconductor material within the trench and laterally outwards from a sidewall surface of the semiconductor barrier layer to provide a III-V compound semiconductor layer; and
    removing a defect-containing region of the III-V compound semiconductor layer.

2. The method of claim 1, wherein the first germanium concentration is from 20% to 25%, and the second germanium concentration is from 50% to 70%.

3. The method of claim 1, wherein the defect-containing region is removed by an anisotropic etch.

4. The method of claim 3, wherein the anisotropic etch also removes the semiconductor barrier layer, the germanium-enriched region and the oxide region.

5. The method of claim 1, wherein the sacrificial semiconductor layer is removed by a lateral etch, and the lateral etch comprises hydrogen peroxide or gaseous HCl.

6. The method of claim 1, wherein said growing comprises an aspect ratio trapping process, and wherein the defect-containing region is formed adjacent the sidewall surface of the semiconductor barrier layer.

7. The method of claim 1, further comprising forming a dielectric liner over a top surface and sidewall surfaces of the sacrificial semiconductor layer prior to the forming the dielectric material layer, wherein the first trench opening also extends through the dielectric liner.

8. The method of claim 1, further comprising removing the dielectric material layer after the removing the defect-containing region.

9. The method of claim 1, further comprising providing a semiconductor layer over another region of the insulator layer, wherein the semiconductor layer comprises silicon, germanium, or silicon germanium, and the another region is masked by the dielectric material layer.

10. The method of claim 1, wherein the forming the first trench opening comprises:
    forming a first mask layer over the dielectric material layer;
    patterning the first mask layer to provide a first opening extending through the first mask layer, wherein the first opening exposes a first end of the sacrificial semiconductor layer; and
    removing portions of the dielectric material layer and the sacrificial semiconductor layer that are exposed by the first opening to provide the first trench opening.

11. The method of claim 10, further comprising removing the first mask layer after the forming the oxide region and the Ge-enriched region.

12. The method of claim 11, wherein the forming the second trench opening comprises:
    forming a second mask layer over the dielectric material layer, the oxide region and the insulator layer, wherein the second mask layer completely fills the first trench opening;
    patterning the second mask layer to provide a second opening extending through the second mask layer, wherein the second opening exposes a second end of the sacrificial semiconductor layer opposite to the first end; and
    removing portions of the dielectric material layer and the sacrificial semiconductor layer that are exposed by the second opening to provide the second trench opening.

13. The method of claim 12, further comprising removing the second mask layer after the removing the sacrificial semiconductor layer.

* * * * *